United States Patent
Smith

(10) Patent No.: US 6,858,835 B2
(45) Date of Patent: Feb. 22, 2005

(54) ELECTRONIC TILT SWITCH AND INTEGRATED LIGHT MODULE

(75) Inventor: William Colie Smith, McMinnville, TN (US)

(73) Assignee: Federal-Mogul World Wide, Inc., Southfield, MI (US)

(*) Notice: Subject to any disclaimer, the term of this patent is extended or adjusted under 35 U.S.C. 154(b) by 81 days.

(21) Appl. No.: 10/144,108

(22) Filed: May 13, 2002

(65) Prior Publication Data

US 2003/0209654 A1 Nov. 13, 2003

(51) Int. Cl.[7] ............ G01D 5/34; G06M 7/00; H01J 40/14
(52) U.S. Cl. ........... 250/231.1; 250/221; 250/222.1; 340/689; 73/514.31; 73/514.26
(58) Field of Search ............ 298/17 R, 22 R; 73/514; 250/214 SW, 221, 222.1, 229, 231.1; 340/689; 200/61.45 R, 61.52, 52 A; 335/205–207

(56) References Cited

U.S. PATENT DOCUMENTS

| | | |
|---|---|---|
| 3,564,171 A | 2/1971 | Hammond |
| 3,599,745 A | 8/1971 | Hughes |
| 3,601,729 A | 8/1971 | Hierta |
| 4,479,111 A | 10/1984 | Madsen et al. |
| 4,644,117 A | 2/1987 | Grimes et al. |
| 4,820,888 A | 4/1989 | Shields |
| 4,864,087 A | 9/1989 | Chen |
| 4,956,629 A | 9/1990 | Chen |
| 4,988,839 A | 1/1991 | Kennicott |
| 5,013,909 A | 5/1991 | Sondergeld et al. |
| 5,134,283 A | 7/1992 | Shiozawa |
| RE34,175 E | 2/1993 | Grimes et al. |
| 5,202,559 A | 4/1993 | Durst |
| 5,209,343 A | 5/1993 | Romano et al. |
| 5,256,839 A | 10/1993 | Gallagher |
| 5,325,078 A * | 6/1994 | Carothers .............. 335/205 |
| 5,373,125 A | 12/1994 | Ford et al. |
| 5,373,153 A * | 12/1994 | Cumberledge et al. .. 250/231.1 |
| 5,457,293 A | 10/1995 | Breed |
| 5,477,428 A | 12/1995 | Brown et al. |
| 5,669,696 A | 9/1997 | Brown et al. |
| 5,798,912 A | 8/1998 | Brown et al. |
| 5,804,816 A | 9/1998 | Yamamoto et al. |
| 5,920,046 A | 7/1999 | Takagi |
| 5,926,099 A | 7/1999 | Unum |
| 5,955,714 A | 9/1999 | Reneau |
| 6,004,254 A | 12/1999 | Murata |
| 6,005,205 A | 12/1999 | Chou |
| 6,011,254 A | 1/2000 | Sano et al. |
| 6,041,187 A | 3/2000 | Okumura et al. |
| 6,131,456 A | 10/2000 | Mattes et al. |
| 6,140,635 A * | 10/2000 | Kazumi et al. ......... 250/231.1 |
| 6,229,300 B1 * | 5/2001 | Dlugos ............... 324/207.13 |
| 6,543,147 B2 * | 4/2003 | Akieda ................. 33/366.24 |

* cited by examiner

Primary Examiner—Stephone B. Allen
Assistant Examiner—Patrick J. Lee
(74) Attorney, Agent, or Firm—Howard & Howard

(57) ABSTRACT

An electronic tilt switch for controlling an electrical circuit such as a vehicle hood lamp circuit according to the angle of inclination of the tilt switch. The tilt switch includes a housing, a sliding element, and a solid state electronic sensor, which can comprises a Hall effect sensor or a photo-optical interrupter. The sliding element moves within an axial bore of the housing according to the angle of inclination of the tilt switch. The solid state electronic sensor is mounted to one axial end of the housing and is capable of determining when the sliding element slides past a predetermined position within the bore. This allows the tilt switch to determine whether the vehicle hood has been opened or shut, and is used to turn the lamp on or off accordingly. The housing, sliding element, sensor, and associated electronics can all be environmentally sealed within a single package, which can additionally include one or more molded in connectors. Also disclosed is an integrated tilt switch/lighting module in which one or more light sources are integrated into the sealed package.

25 Claims, 2 Drawing Sheets

ELECTRONIC TILT SWITCH AND INTEGRATED LIGHT MODULE

TECHNICAL FIELD

The present invention relates generally to tilt switches used in electronic circuits and to such switches used in automotive lighting applications; for example, as a trunk or hood switch used to activate a light when a vehicle trunk or hood is opened.

BACKGROUND OF THE INVENTION

Traditionally, tilt switches made from mercury capsules have been used in a wide variety of applications. For instance, mercury switches have been utilized in lighting circuits that control lights located on the underside of vehicle hoods. When the hood is opened, and hence tilted beyond a certain angle, the switch would turn on a light. A non-automotive example is in simple residential thermostats where the mercury switch is mounted on a spiral flat spring and used to switch on and off a HVAC system as the spring thermally expands or contracts. However, in an effort to limit mercury contamination due to improper disposal of the mercury switches at the end of their useful life, it has become desirable to find a tilt switch design which does not utilize mercury. This has resulted in the development of different tilt switch designs that use non-mercury based components, such as permanent magnet/reed switch combinations, to sense changes in inclination.

For example, U.S. Pat. No. 4,820,888 issued Apr. 11, 1989 to Shields discloses the use of a magnetically operated tilt switch assembly that generally includes a reed switch, an elongated cavity, and a sliding magnet. When the switch assembly tilts beyond a predetermined angle, the magnet slides within the cavity towards and away from the reed switch, which is located at one axial end of the cavity. The proximity of the magnet to the reed switch controls the operation of the switch assembly.

Similarly, U.S. Pat. No. 3,564,171 issued Feb. 16, 1971 to Hammond discloses a magnetic filed activated tilt switch assembly having an elongated cavity for receiving a sliding magnet. The magnet comprises a bar magnet sandwiched between two ferrous balls which are wide enough that the magnet does not come in direct contact with the sides of the cavity. As the switch housing is tilted beyond a predetermined angle, the magnet slides towards or away from a reed switch mounted on the topside of the cavity, thereby closing the switch when the magnet is in close proximity and opening the switch when the magnet is at the other end of the cavity.

U.S. Pat. No. 3,601,729 issued Aug. 24, 1971 to Hierta also teaches the use of a tilt switch assembly incorporating a reed switch to detect inclination of the device beyond a certain angle. The tilt switch assembly that includes a switch housing having an elongated V-shaped cavity which contains a cylindrical magnetic member. The apex of the cavity is closest in distance to a reed style switch. Accordingly, when the switch housing is in an upright (non-tilted) orientation, the magnetic flux from the magnetic member is strong enough to pull the two contacts of the reed switch together, thereby closing the switch. As the switch housing is tilted, the magnetic member rolls away from the apex, thereby becoming sufficiently spaced from the reed switch and unable to pull the switch contacts together.

U.S. Pat. No. 5,209,343 issued May 11, 1993 to Romano et al. discloses a magnetic field sensing tilt switch, shown in FIG. 21, that generally comprises a cup shaped housing, a magnetized ball, and a magnetic sensor switch. As the switch assembly is tilted, the ball rolls towards and away from the magnetic field sensing switch, thus causing the switch to change states according to the position of the ball within the housing.

Further examples of tilt switch assemblies utilizing reed switches can be found in U.S. Pat. Nos. 5,256,839, 5,477,428, 5,669,696, and 5,798,912. Other magnetically-actuated switch designs have been proposed using Hall effect sensors rather than reed switches. See, for example, U.S. Pat. No. 5,373,125, issued Dec. 13, 1994 to Ford et al. This patent discloses a magnetic field sensing tilt switch assembly wherein a pivotal member having a permanent magnet pivots within a switch housing containing a Hall effect sensor. When the switch assembly is in an upright position the magnetic field is aligned with the sensor, however, when the switch assembly is tilted, the magnet and the sensor become unaligned, which results in the switch changing states.

Apart from magnetic switches, other non-mercury based technologies such as photoelectric detectors have been used in tilt switches. For example, U.S. Pat. No. 5,202,559 utilizes a photo-optical interrupter and a box-like chamber and ball to detect a tilt beyond a predetermined angle. Two of the four interior side walls of the box have light emitting means mounted such that they communicate with light detecting means mounted on the opposing interior wall, and each interior side wall has a semi-spherical recess designed to receive the ball. When the switch is tilted beyond a predetermined angle, the ball rolls downwards and seats on the lowest recess, thereby obstructing the light emitting and detecting means associated with that recess and changing the state of the switch.

Likewise, U.S. Pat. No. 5,209,343 discloses a photo-optical tilt switch, seen in FIG. 18, that includes a cylindrical housing containing a weighted ball. At one axial end of the housing is a light transmitter and light receiver mounted in opposing fashion along the interior walls of the housing. Thus, when the switch assembly is tilted, the ball rolls to the end of the cylindrical housing having the light sensing components and prevents the optical receiver from receiving the emitted light, thus causing the switch to change states. Additional tilt switch designs incorporating photo-optical interrupters can be seen in U.S. Pat. Nos. 5,373,153, 6,011,254, and 6,140,635.

SUMMARY OF THE INVENTION

In accordance with one aspect of the present invention, there is provided an electronic tilt switch capable of controlling the state of an electrical circuit according to the angle of inclination of the switch. The switch includes a housing having an elongated bore that extends internally within the housing, a sliding element confined within the bore, and a solid state electronic sensor located adjacent the bore. The sliding element can slide along the length of the bore into and out of a predetermined position within the bore. The sensor is capable of sensing when the angle of inclination of the switch exceeds a predetermined amount by determining when the sliding element is located at the predetermined position.

The solid state electronic sensor can be any of a number of different suitable devices, such as, for example, a Hall effect sensor or photo-optical interrupter. In the case of a Hall effect sensor, the sliding element can be a permanent magnet that produces a magnetic field which is sensed by the Hall effect sensor when the magnet slides into the predetermined position within the bore. Where a photo-optical interrupter is used, the sensor is located such that it establishes a light path that extends across at least a portion of the elongated bore at the predetermined position. The sliding element can then be made from an opaque material such that it obstructs the light path when it moves into the predetermined position. The tilt switch can include an electrical connector for easy connection to the switch, as well as an electrical circuit interconnecting the sensor and connector. Preferably, the housing, sliding element, sensor, and electrical circuit are located internally within an environmentally sealed package.

In accordance with another aspect of the present invention, there is provided an integrated electronic tilt switch and lighting module that can be used as, for example, an under-the-hood lamp for a vehicle to illuminate the engine compartment when the vehicle hood is raised. The module comprises a housing having an elongated bore that extends internally within the housing, a sliding element confined within the bore, a solid state electronic sensor, a light source, and an electrical circuit located connected to both the sensor and light source. The sensor detects when the sliding element moves to a predetermined position within the bore, and the circuit responds to the sensor to switch on (or off) the light source. The housing, sliding element, sensor, and electrical circuit are all located internally within an environmentally sealed package. Preferably, the housing includes an integral connector located at an exterior surface of the package.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE PREFERRED EMBODIMENTS

Figure 1:
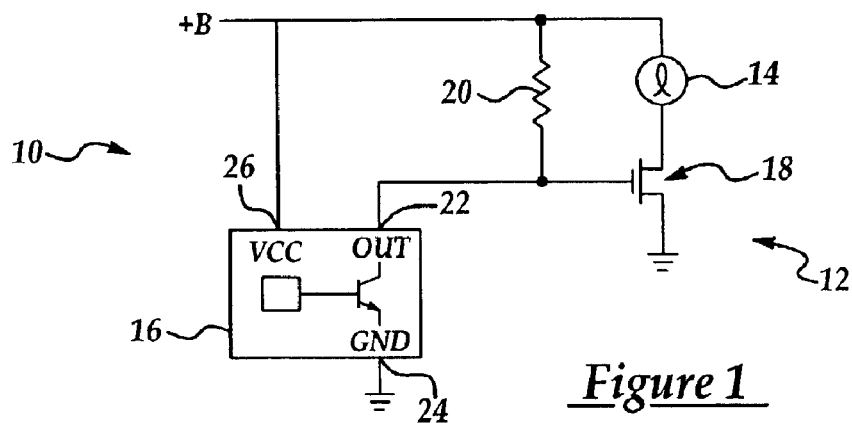
FIG. 1 is a schematic view of an electronic tilt switch constructed in accordance with a first embodiment of the present invention and utilizing a Hall effect sensor in the tilt switch to control energization of a lamp.

Referring now to FIG. 1, there is seen a schematic view of a lighting module 10 that includes an electronic circuit 12 that controls the operation of a lamp 14 according to the angle of inclination of an electronic tilt switch 16. The lighting module 10 can be used in any of a number of different applications, and the following discussion will be directed to its use for an automotive under-the-hood application in which the module 10 is located under a vehicle's hood (not shown) so that the lamp 14 is energized when the hood is raised, and is extinguished when the hood is lowered and closed. Generally, the tilt switch 16 is mounted to the underside of the vehicle hood such that pivotal upward movement of the hood causes the tilt switch to change its angle of inclination. When the hood is opened, the angle of inclination of the tilt switch 16 exceeds a certain angle sufficient for the switch to change states, and the circuit 12 is responsive to this change in state to energize the lamp 14. When the hood is closed, the angle of inclination of the tilt switch 16 falls below the angle required for activation, and the tilt switch turns the hood lamp 14 to off via the circuit 12. As shown, power is supplied from the vehicle battery via a supply rail +B and is supplied both to the circuit 12 and tilt switch 16.

The electronic tilt switch 16 of FIG. 1 is a Hall effect sensor type switch that generally includes an output 22, a ground connection 24, and a voltage source input 26. As will be appreciated by those skilled in the art, the following description of the Hall effect sensor is directed to the logic involved in operating the lamp based on tilt switch position and is not meant to describe any particular commercially available Hall effect sensor. Rather, those skilled in the art will know how to obtain the desired switching of the lamp using different Hall effect sensor arrangements together with suitable circuitry to implement the necessary switching logic. For the particular arrangement shown, when the tilt switch 16 is oriented such that it is in its "off" position, its internal transistor switch is biased on, which connects its output 22 to ground 24. Output 22 is connected to the gate of an N-channel MOSFET transistor 18, such that pulling its gate to ground causes the transistor to function in an "off" state. Accordingly, hood lamp 14 is disconnected from voltage source +B and therefore does not illuminate. Once the hood is opened and pivots such that the tilt switch is oriented beyond the minimum number of degrees required, tilt switch 16 switches off its transistor providing a high impedance state on output 22. This allows application of the supply voltage +B to the gate of transistor 18 via a pullup resistor 20, thereby causing transistor 16 to operate in an "on" state. In this state, the transistor is conductive and connects the hood lamp 14 to the voltage source +B, thus turning on the lamp and illuminating the surrounding area. Again, the illustrated circuitry is but one approach to utilizing the Hall effect sensor switch and it will be understood that any of a number of other circuits can be designed to utilize a Hall effect sensor type tilt switch without departing from the scope of the present invention.

Figure 2:
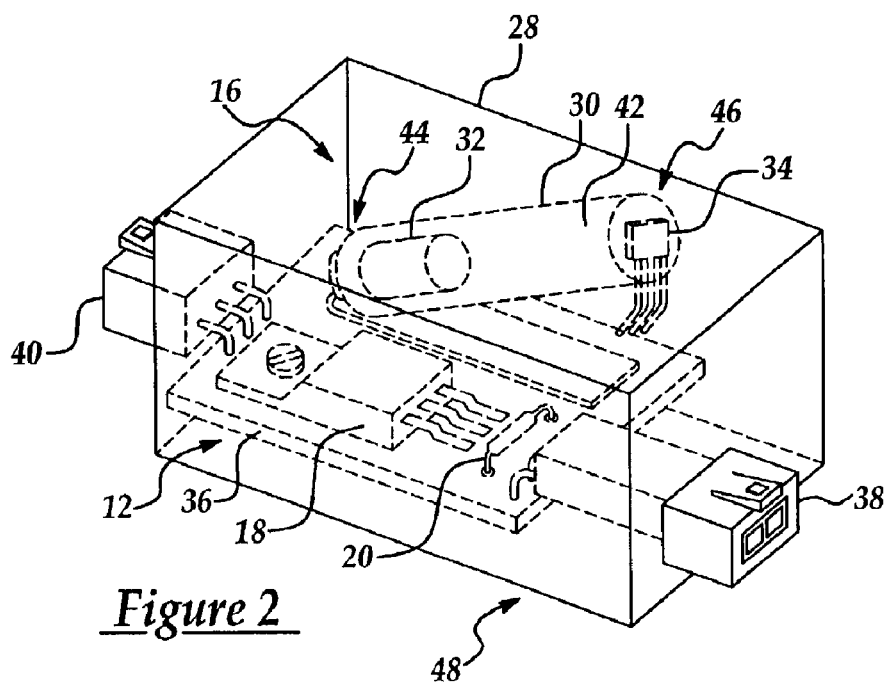
FIG. 2 is a perspective view of the tilt switch of FIG. 1.

Referring now to FIG. 2, the Hall effect sensor tilt switch 16 is seen in further detail and generally includes an elongated, cylindrical housing 30, a magnetic sliding element 32, a Hall effect sensor 34, and the electrical circuit 12 which is mounted on a printed circuit board 36. All of these components are mounted within an environmentally sealed package 28 to protect them against moisture and contaminants. The tilt switch 16 also includes an input connector 38 and an output connector 40 mounted at opposed exterior surfaces of the package 28. Housing 30 can be a rigid cylindrical plastic component having an elongated cylindrical bore 42 extending from a first axial end 44 to a second axial end 46. Sliding element 32 is shaped to be received by the cylindrical bore 42 such that it is freely capable of sliding along the longitudinal axis of the bore. For this purpose, the sliding element 32 and/or the bore surface itself can be provided with a lubricant, such as Teflon™ or graphite, that is either provided as a part of the components themselves (e.g., a coating) or separately applied during assembly of the device.

Housing 30 is mounted to the printed circuit board (PCB) 36 and inclines upwardly away from the PCB such that the sliding element 32 moves to the first axial end 44 under the force of gravity when the bottom surface 48 and, hence, the PCB 36, is placed in a substantially horizontal orientation. As will be appreciated, when the package 28 is tilted through an angle sufficient to raise the first axial end 44 well above the second axial end 46, the sliding element 32 will move to the second axial end 46 under the force of gravity. To detect this movement, the Hall effect sensor 34 is located adjacent the housing 30 at a predetermined position along the length of the bore which in the illustrated embodiment is at the second axial end 46. The sliding element 32 is a permanent magnet that produces a magnetic field which impinges upon the Hall effect sensor 34 when the sliding element moves to the predetermined position at the second axial end 46. The Hall effect sensor 38 utilizes the magnetic field produced by the sliding magnetic element to induce a voltage according to a phenomenon known as the Hall effect, which is commonly known in the art. When the magnetic field exceeds a predetermined amount, the switch is in an "on" state and turns on lamp 12 accordingly. When the magnetic field produced by sliding magnetic component 32 is less than that required for activation of the tilt switch, then the switch operates in an "off" state and the lamp 14 is not supplied with power. The Hall effect sensor 34 can be electrically connected to the circuit 12 by means of jumper wires (not shown); and these wires correspond to the connections 22, 24, and 26 previously discussed.

In operation, when tilt switch 16 is in a generally horizontal orientation, as when the vehicle hood is closed thus making housing 30 inclined downwardly towards its first end 44, the sliding element 32 is generally located at the axial end 44 opposite the Hall effect sensor 34, as shown. Because the sliding element is separated from the Hall effect sensor by the axial length of the bore, the magnetic field experienced by the sensor is too weak to activate the tilt switch. Once the switch 16 is tilted enough to cause the sliding element 32 to slide to the second axial end 46 of the housing under the force of gravity, the field produced by the sliding element and sensed by the Hall effect sensor is strong enough to cause the switch to change states, thereby enabling circuit 12 to energize the lamp 14. The lamp remains on until the angular inclination of the tilt switch 16 again approaches horizontal, at which time magnetic member 32 slides away from the Hall effect sensor 34 to the opposite end 44 of the housing, thereby turning the switch and the lamp off.

It should be noted that tilt switch 14 could operate in a converse manner. That is, the electronic tilt switch could be designed such that it operates in an "off" state, thus turning off lamp 14, when sliding element 32 is located at the second axial end 46. In this embodiment, pivoting the tilt switch beyond a certain number of degrees would cause the sliding element 32 to slide away from the Hall effect sensor 34 and towards the first axial end 44, thereby turning both switch 16 and the lamp 14 to an "on" state.

Preferably, connectors 38 and 40 are integrally and rigidly connected to scaled package 28, and these connectors can include latch mechanisms to permit secure mating and retention of a connection plug from a wiring harness or the like. The connectors can also be keyed to prevent improper insertion of the mating plugs. The components that are environmentally sealed within package 28 can be assembled to the printed circuit board 36 which can then be inserted into an open side of package 28 and, once positioned within the package, can be potted in place to seal them within the package. Other techniques for environmentally sealing these components within package 28 will be known to those skilled in the art.

Figure 3:
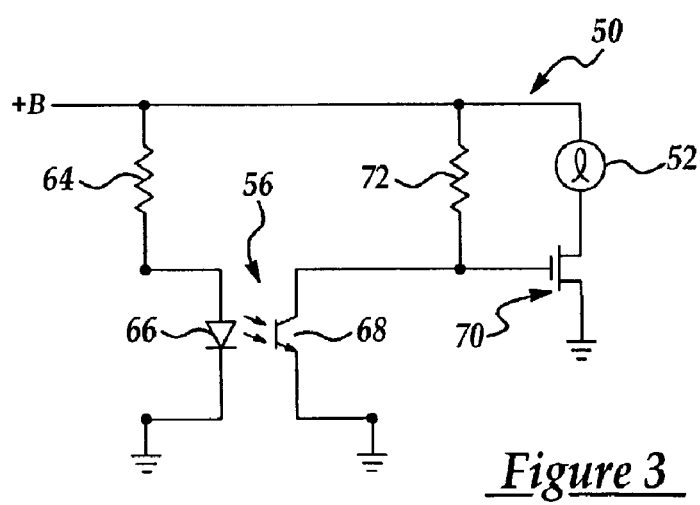
FIG. 3 is a schematic view of an electronic tilt switch constructed in accordance with a second embodiment of the present invention and utilizing a photo-optical interrupter in the tilt switch to control energization of a lamp.
Figure 4:
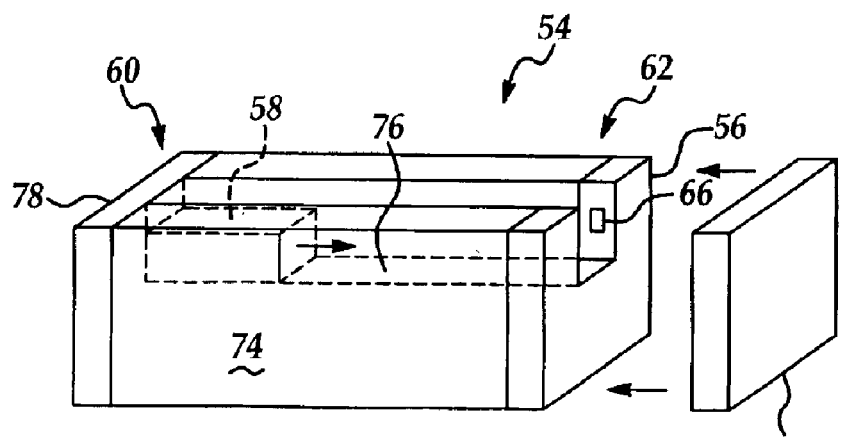
FIG. 4 is a perspective view of the tilt switch of FIG. 3.

Referring now to FIGS. 3 and 4, there is seen a schematic view of an electronic circuit 50 incorporating an alternative embodiment 54 of the tilt switch of the present invention, again used for a vehicle hood lighting circuit to illuminate a lamp 52. This embodiment is the same as that of FIGS. 1 and 2, with the exceptions noted below. In particular, the Hall effect sensor is replaced by a photo-optical interrupter 56 and the tilt switch mechanical design is altered accordingly to utilize this photo interrupter to detect when the sliding element 58 is situated at the predetermined position (second axial end 62). Schematically, as shown in FIG. 3, the circuit design is modified to include the photo interrupter 56 in place of the Hall effect sensor with a current limiting resistor 64 in series with the photo interrupter's power input. The photo interrupter 56 is an infrared semiconductor switch having a photo diode 66 and a photo transistor 68. Light from the photo diode 66 traverses a gap between the two components and impinges upon the photo transistor 68, thereby allowing current flow through the transistor between its collector and emitter. In this state, the gate of the MOSFET 70 is clamped to ground, holding it and lamp 52 in an "off" state. If the light from photodiode 66 is obstructed from reaching the photo transistor 68, then the transistor 68 switches off, allowing the MOSFET 70 to be biased on by way of the pullup resistor 72. As a result, the lamp 52 is energized.

As shown in FIG. 4, the electronic tilt switch 54 incorporating the photo-optical interrupter 56 is seen in further detail. This tilt switch 54 can be substituted into the overall module shown in FIG. 2 in place of the Hall effect sensor and its associated housing and sliding element. For tilt switch 54, the sliding element 58 need not be a magnet, but instead is optically opaque to the light transmitted by the photo diode 66. As shown, housing 74 includes a axial bore 76 extending along its longitudinal length to accommodate the sliding element 58. In the particular embodiment seen, the axial bore is open upon its upper side; however, the bore could instead be a closed bore such that it encloses the sliding element within the housing. At the first axial end 60 of the housing 74, there is provided an end cap 78 to prevent the sliding element 58 from sliding out of the bore 76. Of course, a similar top cap (not shown) could be used to prevent the sliding piece from coming up out of the channel. The photo interrupter 56 is located at the second axial end 62 of the bore, and includes a physical gap between the photo diode 66 and photo transistor 68 (not shown) which permits the sliding element 58 to move in between the photo diode and photo transistor to obstruct the light path that otherwise normally exists between these components. A second end cap 80 can be used at this second end 62 to keep the sliding element 58 in the bore.

In a manner of operation similar to the Hall effect sensor tilt switch previously described, the electronic photo-optical interrupter tilt switch 54 is in an "off" state when sliding member 58 does not interfere with the light path established at the first axial end of the housing and is in an "on" state when the switch is tilted such that the sliding member slides into a light path obstructing position. The non-interfering, "off" state condition is shown in FIG. 4. In this position, a light path is established between photo diode 66 and photo transistor 68 (not shown) such that lamp 52 in the corresponding circuit is not powered and therefore is off. Once the vehicle hood is pivoted beyond a certain angle of inclination, sliding element 58 moves from the first axial end 60 of the housing to the second axial end 62. When the sliding element reaches the second end, it obstructs the light path such that the photo transistor 68 is unable to receive light emitted from the photo diode 66. As previously described in conjunction with FIG. 3, the obstruction of the light path turns on lamp 52 such that it illuminates the surrounding area. When the vehicle hood is closed, the electronic switch assumes a position that causes the sliding element 58 to slide to the first end 60, thereby turning lamp 52 off again. Accordingly, the electronic switch 54 is capable of controlling an associated circuit 50, such as a vehicle engine compartment lighting circuit, by its angle of inclination.

Again, it should be noted that tilt switch 54 could operate in an opposite manner. That is, the electronic tilt switch could be designed such that it operates in an "off" state, thus turning off lamp 52, when the sliding element 58 is located at second axial end 62. In this embodiment, pivoting the tilt switch beyond a certain number of degrees would cause the sliding element to slide away from the photo-interrupter towards the first end 60, thereby turning both switch 54 and lamp 52 to an "on" state.

Figure 5:
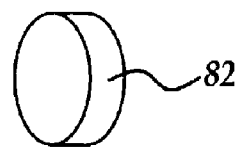
FIG. 5 is a perspective view of an opaque disk that can be used in the tilt switch of FIGS. 3 and 4.

In lieu of the sliding element 58, an opaque disk 82 can be used, as shown in FIG. 5. This disk is sized in diameter and thickness to fit within the bore such that it can roll between the first and second ends 60, 62 depending upon the angle of inclination of the tile switch.

Figure 6:
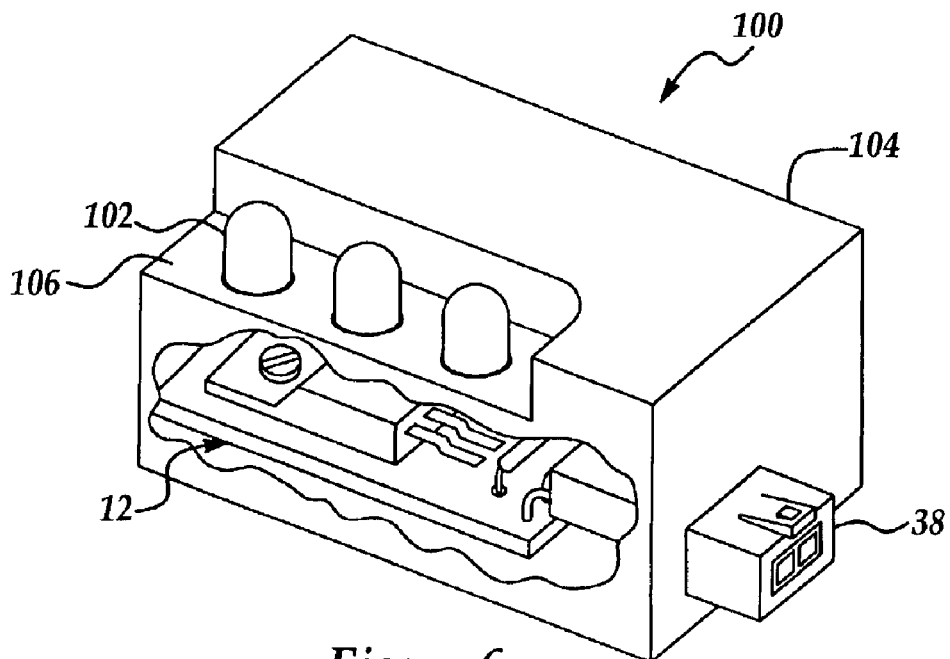
FIG. 6 is a perspective view of an integrated electronic tilt switch and lighting module wherein portions of the internal components of the module can be seen in cutaway.

Referring to yet another embodiment of the present invention, FIG. 6 illustrates an electronic tilt switch/lighting module 100 which incorporates electronic circuit 12 and Hall effect sensor tilt switch 16 of FIGS. 1 and 2 along with an integral light source such as three white LEDs 102. Incandescent or other types of light sources can be used instead of the LEDs. Also, the photo interrupter tilt switch 54 or other suitable tilt switch can be utilized in lieu of switch 16. Integrating the lamp together with the tilt switch assembly into a single module makes attaching the single module to the vehicle easier than attaching these components separately along with their associated wiring. This approach also eliminates the need for the output connector 40. The tilt switch (along with its housing, sliding element, and sensor) and the electronic circuit, including its printed circuit board, are all environmentally sealed within a single package 104. Furthermore, both the LEDs and connector 38 can be sealed in place on the housing, making all of the internal wiring connections completely sealed against moisture and contaminants.

As shown, the LEDs 102 can be located in a recessed area 106 located on the top surface of package 104. They are wired to the printed circuit board prior to the entire contents of the package 104 being potted or otherwise sealed inside the package. If desired, the surface of the recessed area 106 can be utilized as a reflector with a suitable geometry and/or coating to control the distribution of light emitted from the module 100.

It will thus be apparent that there has been provided in accordance with the present invention an electronic tilt switch and an integrated electronic tilt switch and lighting module which achieves the aims and advantages specified herein. It will of course be understood that the foregoing description is of preferred exemplary embodiments of the invention and that the invention is not limited to the specific embodiments shown. Various changes and modifications will become apparent to those skilled in the art and all such variations and modifications are intended to come within the spirit and scope of the appended claims.

I claim:

1. An electronic tilt switch capable of controlling the state of an electrical circuit according to the angle of inclination of said switch, comprising:

a housing having an elongated bore that extends internally within said housing from a first end to a second end, said bore being at least partially closed at said second end;

a sliding element located within said bore and being capable of sliding into and out of a predetermined position located near said second end of said bore; and a solid state electronic sensor supported by said housing adjacent said second end and remotely of said first end, wherein said sensor is capable of sensing the presence of said sliding element at said predetermined position when said sliding element is stationary relative to said housing, and wherein said sensor provides a first output state when said sliding element is located at said first end and a second output state when said sliding element is located at said predetermined position within said bore.

2. An electronic tilt switch as defined in claim 1, wherein said solid state electronic sensor is a Hall effect sensor capable of detecting a magnetic field and wherein said sliding element is a magnetic sliding element that produces a magnetic field.

3. An electronic tilt switch as defined in claim 1, further comprising an electrical connector and an electrical circuit interconnecting said sensor and said connector.

4. An electronic tilt switch as defined in claim 3, further comprising an environmentally sealed package, wherein said housing, sliding element, sensor, and electrical circuit are environmentally sealed within said package and wherein said connector is located at an exterior surface of said package.

5. An electronic tilt switch as defined in claim 4, wherein said housing and electrical circuit are both mounted on a printed circuit board that is environmentally sealed within said package.

6. An integrated electronic tilt switch and lighting module, comprising at least one LED and the electronic tilt switch defined in claim 1.

7. An electronic tilt switch capable of controlling the state of an electrical circuit according to the angle of inclination of said switch, comprising:

a housing having an elongated bore that extends internally within said housing between first and second axial ends, said bore being at least partially closed at said second axial end:

a sliding element confined within said bore and being capable of sliding into and out or a predetermined position located near said second axial end of said bore;

a solid state electronic sensor mounted to said housing near said second axial end of said bore, wherein said sensor is capable of sensing when the angle of inclination of said switch exceeds a predetermined amount by determining when said sliding element is located at said predetermined position within said bore; and wherein said solid state electronic sensor is a photo-optical interrupter capable of establishing a light path extending across at least a portion of said elongated bore at said predetermined position, and wherein said sliding element comprises an opaque material such that said sliding element is capable of obstructing said light path when said sliding element is located at said predetermined position.

8. An electronic tilt switch capable of controlling the state of an electrical circuit according to the angle of inclination of said switch, comprising:

a housing having an elongated bore that extends internally within said housing, said bore being obstructed at both a first and a second axial end;

a magnetic sliding element located within said bore and being capable of sliding along the length of said bore only between said first and second axial ends according to the angle of inclination of said switch; and a solid state electronic Hall effect sensor mounted near said second axial end of said bore, wherein said sliding element is located at said first axial end of said bore when said switch is at a first angle of inclination and thereafter slides to said second axial end of said bore when said switch is moved to a second angle of inclination, and wherein said Hall effect sensor is capable of sensing when said switch is at said second angle of inclination by sensing the magnetic field created by said magnetic sliding element when it moves to said second axial end of said bore.

9. An electronic tilt switch as defined in claim 8, wherein said tilt switch further includes a voltage source input, a ground connection, and an output.

10. An electronic tilt switch as defined in claim 9, wherein said output is coupled to said ground connection when said tilt switch is in an "off" state and said output is coupled to said voltage source input when said tilt switch is in an "on" state.

11. An electronic tilt switch as defined in claim 10, wherein said output is connected to a transistor which controls the state of the electrical circuit.

12. An electronic tilt switch as defined in claim 8, wherein said tilt switch is mounted to the underside of a vehicle hood.

13. An integrated electronic tilt switch and lighting module, comprising at least one LED and the electronic tilt switch defined in claim 8.

14. An electronic tilt switch capable of controlling the state of an electrical circuit according to the angle of inclination of said switch, comprising:

a housing having an elongated bore that extends internally within said housing, said bore having a first cross-sectional shape;

an opaque sliding element located within said bore and being capable of sliding along the length of said bore according to the angle of inclination of said switch, said sliding element having a second cross-sectional shape that is similar to said first cross-sectional shape; and a solid state photo-optical interrupter located at one axial end of said housing and capable of establishing a light path that extends across at least a portion of said elongated bore, wherein said photo-optical interrupter is capable of sensing when the angle of inclination of said switch exceeds a predetermined amount by determining when said opaque sliding element obstructs said light path.

15. An electronic tilt switch as defined in claim 14, wherein said tilt switch is mounted to the underside of a vehicle hood.

16. An electronic tilt switch as defined in claim 14, wherein said opaque sliding element is a generally rectangular block, and wherein said first and second cross-sectional shapes are generally rectangular.

17. An integrated electronic tilt switch and lighting module, comprising:

a housing having an elongated bore that extends internally within said housing;

a movable element confined within said bore and being capable of moving into and out of a predetermined position within said bore;

a solid state electronic sensor located adjacent said bore such that said sensor can detect when said movable element is located at said predetermined position;

a light source comprising at least one LED;

an electrical circuit connected to both said sensor and said light source, said circuit being responsive to said sensor to selectively energize or de-energize said light source based on the angle of inclination of said housing; and an environmentally sealed package having at least one opening, wherein, said housing, movable element, sensor, and electrical circuit are environmentally sealed internally within said package, and said LED protrudes through said opening.

18. An integrated electronic tilt switch and lighting module as defined in claim 17, wherein said solid state electronic sensor is a Hall effect sensor capable of detecting a magnetic field.

19. An integrated electronic tilt switch and lighting module as defined in claim 18, wherein said movable element is a permanent magnet sliding element.

20. An integrated electronic tilt switch and lighting module as defined in claim 17, wherein said solid state electronic sensor is a photo-optical interrupter capable of establishing a light path extending across at least a portion of said elongated bore at said predetermined position.

21. An integrated electronic tilt switch and lighting module as defined in claim 20, wherein said movable element is an opaque sliding element.

22. An integrated electronic tilt switch and lighting module as defined in claim 20, wherein said movable element is an opaque disk that rolls along said bore.

23. An integrated electronic tilt switch and lighting module as defined in claim 17, wherein said light source comprises a vehicle compartment light.

24. An integrated electronic tilt switch and lighting module as defined in claim 17, further comprising an integral connector located on an exterior surface of said sealed package and being electrically connected to said circuit within said package.

25. An integrated electronic tilt switch and lighting module, comprising:

a tilt switch comprising:
a housing;
a movable element confined within said housing and being responsive to changes in an angle of inclination of said housing to move into and out of a predetermined position within said housing; and
a solid state electronic sensor located at or near said housing such that said sensor can detect when said movable element is located at said predetermined position;

at least one LED having electrical terminals and a light emitting portion;

an electrical circuit connected to both said sensor and said LED, said circuit being responsive to said sensor to selectively energize or de-energize said LED based on the angle of inclination of said housing; and a sealed package, wherein said tilt switch and electrical circuit are sealed internally within said package, and wherein said package has at least one opening with said LED protruding through said opening, said package being sealed at said opening about said LED such that said light emitting portion of said LED is exposed externally of said package and said electrical terminals of said LED are sealed within said package.

* * * * *